US011372040B2

(12) United States Patent
Wiedenbauer

(10) Patent No.: US 11,372,040 B2
(45) Date of Patent: Jun. 28, 2022

(54) METHOD AND ARRANGEMENT FOR DETECTING PARTIAL DISCHARGES IN AN ELECTRIC OPERATING MEANS

(71) Applicant: Siemens Energy Global GmbH & Co. KG, Munich (DE)

(72) Inventor: Anton Wiedenbauer, Wellheim (DE)

(73) Assignee: SIEMENS ENERGY GLOBAL GMBH & CO. KG, Munich (DE)

(*) Notice: Subject to any disclaimer, the term of this patent is extended or adjusted under 35 U.S.C. 154(b) by 0 days.

(21) Appl. No.: 16/641,736

(22) PCT Filed: Sep. 19, 2018

(86) PCT No.: PCT/EP2018/075266
§ 371 (c)(1),
(2) Date: Feb. 25, 2020

(87) PCT Pub. No.: WO2019/057735
PCT Pub. Date: Mar. 28, 2019

(65) Prior Publication Data
US 2020/0249268 A1    Aug. 6, 2020

(30) Foreign Application Priority Data
Sep. 20, 2017   (DE) .................... 10 2017 216 644.4

(51) Int. Cl.
*G01R 31/12*    (2020.01)
*G01R 31/327*   (2006.01)

(52) U.S. Cl.
CPC ....... *G01R 31/1254* (2013.01); *G01R 31/327* (2013.01)

(58) Field of Classification Search
CPC .......................... G01R 31/1254; G01R 31/327
See application file for complete search history.

(56) References Cited

U.S. PATENT DOCUMENTS 5,247,258 A * 9/1993 Tripier ................. G01R 31/12
324/532
5,506,511 A 4/1996 Nilsson et al.
(Continued)

FOREIGN PATENT DOCUMENTS

CN   101741489 A   6/2010
CN   101819246 A   9/2010
(Continued)

OTHER PUBLICATIONS

Wikipedia: "Teilentladung"; Stand: Aug. 15, 2017, https://de.wikipedia.org/w/index.php?title=Teilentladung&oldid=1681, retrieved Jun. 28, 2018; English machine translation attached: Wikipedia: "Partial Discharge".
(Continued)

*Primary Examiner* — Son T Le
*Assistant Examiner* — Adam S Clarke
(74) *Attorney, Agent, or Firm* — Wolter Van Dyke Davis, PLLC

(57) ABSTRACT

A method and arrangement for detecting partial discharges in an electric operating device, wherein electromagnetic pulses are detected by means of a sensor device, a narrow frequency band from a frequency spectrum of the electromagnetic pulses is selected by a filter device, the narrow frequency band is amplified by an amplifier device, and signals contained in the narrow frequency band are compared with a threshold value for the amplitude by an evaluation device, wherein a partial discharge is identified in the event that the threshold value is exceeded.

12 Claims, 5 Drawing Sheets

(56) References Cited

U.S. PATENT DOCUMENTS

| | | | |
|---|---|---|---|
| 8,924,169 B1 | 12/2014 | Ledenev et al. | |
| 2003/0214307 A1* | 11/2003 | Kang | G01R 31/1254 |
| | | | 324/536 |
| 2004/0246000 A1 | 12/2004 | Kuppuswamy | |
| 2010/0073008 A1* | 3/2010 | Twerdochlib | G01R 31/1272 |
| | | | 324/520 |
| 2012/0330583 A1 | 12/2012 | Serra et al. | |
| 2015/0369853 A1* | 12/2015 | Chen | H01Q 1/362 |
| | | | 324/415 |
| 2017/0350934 A1* | 12/2017 | Sathik | G01R 31/2621 |

FOREIGN PATENT DOCUMENTS

| | | |
|---|---|---|
| CN | 102628916 A | 8/2012 |
| CN | 102792174 A | 11/2012 |
| CN | 102866334 A | 1/2013 |
| CN | 103487728 A | 1/2014 |
| CN | 104931868 A | 9/2015 |
| CN | 106324445 A | 1/2017 |
| DE | 10359532 B3 | 6/2005 |
| WO | 9607925 A1 | 3/1996 |

OTHER PUBLICATIONS

PCT International Search Report and Written Opinion of International Searching Authority dated Dec. 19, 2018 corresponding PCT International Application No. PCT/EP2018/075266 filed Sep. 19, 2018.

* cited by examiner

METHOD AND ARRANGEMENT FOR DETECTING PARTIAL DISCHARGES IN AN ELECTRIC OPERATING MEANS

CROSS REFERENCE TO RELATED APPLICATIONS

This application is the US National Stage of International Application No. PCT/EP2018/075266 filed 19 Sep. 2018, and claims the benefit thereof. The International Application claims the benefit of German Application No. DE 10 2017 216 644.4 filed 20 Sep. 2017. All of the applications are incorporated by reference herein in their entirety.

FIELD OF INVENTION

The invention relates to a method and to an arrangement for detecting partial discharges for an electrical apparatus.

BACKGROUND OF INVENTION

Gas-insulated switchgear is known from the product brochure "Gas-Insulated Switchgear, series 8DN8 up to 170 kV, 63 kA, 4000 A" from Siemens AG, 2011, order No. E50001-G620-A122-V1. During condition monitoring for gas-insulated switchgear (GIS), the main focus is on the detection of partial discharges (PD), since these occur in most fault scenarios. The method of choice is to detect the PD by measuring electromagnetic waves that propagate in the GIS during any PD. These are typically captured in the ultra-high frequency range (UHF range), which is situated between a few hundred MHz and a few GHz in the frequency spectrum.

In the event of a PD, electromagnetic pulses typically occur multiple times per sinewave (of the mains voltage, e.g. 50 Hz). These pulses are wideband in nature, but are attenuated by the GIS more in some frequency ranges than in others, depending on design. The ideal frequency range for detecting PDs thus varies for GISs of different type. A method for condition monitoring needs to detect PDs reliably and therefore needs to be sensitive enough to be able to capture the electromagnetic pulses of the GISs to be monitored. To ensure this, the system is adjusted by means of what is known as a calibrator on startup. The calibrator can provide e.g. an electromagnetic reference pulse in order to calibrate the method or the applicable arrangement for detecting partial discharges.

A typical setup for a UHF PD monitoring system consists of filter components, a signal amplification part and an analog-to-digital converter that can generate a 12-bit signal quickly and precisely. Further, interference signal filtering and cause-of-fault detection using what is known as the point-on-wave analysis method are performed. Additionally, data storage, visualization and communication protocols are needed. The underlying hardware and software is sometimes used up to six times per section. This is because e.g. in the case of a three-phase embodiment of a GIS with single-phase encapsulation, a measuring device for PD is needed upstream and downstream of each circuit breaker for each phase. The result of the previous approach is complex and expensive systems that allow technical experts to analyze the cause of a fault and the severity of a fault directly.

By way of example, a digital condition monitoring system for GIS is known by the trade name "Assetguard PDM" from the product brochure "Assetguard Switchgear Condition Monitoring—Integrated Substation Condition Monitoring (ISCM®) for HV Switchgear", Siemens AG 2012, order No.: IC1000-G240-A100-X-4A00. The dissertation "Partial-discharge measurement in the gigahertz frequency range on SF6-insulated switchgear" by Rolf Kurrer from 1997, Institute of Power Transmission and High-Voltage Engineering at the University of Stuttgart, ISBN 3-8265-2211-7, also reveals methods for evaluating UHF signals for detection of partial discharges in GIS.

Other approaches known hitherto use acoustic monitoring for sounds produced during partial discharges or analyze chemical changes in the insulating gas that occur during partial discharges.

SUMMARY OF INVENTION

Against the background of the previously known methods for detecting partial discharges for an electrical apparatus by means of UHF evaluation, the invention is based on the object of specifying a method that is comparatively simple and inexpensive.

The invention achieves this object by means of a method according to claim 1.

It is an advantage of the invention that an electromagnetic pulse of a PD is subjected to narrowband filtering, is amplified and is compared with an adjustable reference voltage. This simplified method allows implementation using analog circuits, which is substantially cheaper and more reliable as compared with the digital systems used to date. Further, it is advantageous that the evaluation of the narrowband signal is possible distinctly more easily than an analysis of a wideband UHF signal, as has been usual in the prior art to date.

Since the method according to the invention is designed as a mere indicator of the presence of partial discharges, it is acceptable if not every PD pulse is detected. Significant PD pulses occur e.g. multiple times per 50 Hz period when there is a fault present in a GIS unit. It is thus sufficient to detect a partial discharge in an acceptable time of for example one second. By way of example, the system can be calibrated during installation such that it avoids false alarms. It is possible for e.g. simple single-point calibration to take place, this being able to be performed comparatively inexpensively and quickly.

In contrast to previous methods, a partial discharge is thus determined purely quantitatively and information about the presence of partial discharges is output in Yes/No form. Instead of subjecting the signal to wideband processing as previously, a narrowband filter is used according to the invention. This narrowband filter allows comparatively good interference rejection in a simple manner. Fast and precise analog-to-digital conversion and evaluation of signals using a digital signal processor is not required.

In one embodiment of the method according to the invention, the sensor devices used are internal and/or external antennas for receiving electromagnetic signals. The internally and externally received UHF signals are each evaluated in the same manner according to the invention. If a PD signal detected by means of an internal antenna also occurs in the received UHF signals of an associated external antenna, then this is externally acting interference rather than a PD occurring in the GIS. Such a signal detected as an external interfering action is therefore not rated as a partial discharge and is ignored for a further evaluation.

In one embodiment of the method according to the invention, the signal of a detected partial discharge is converted into a digital signal by means of a flipflop output. The reference voltage is adjusted beforehand such that the electronic flipflop switches reliably when a reference pulse is supplied. This is an advantage because the complexity of the signal is simplified further. A digital signal means that for example a voltage having a prescribed level is output when a partial discharge is detected and no voltage is output when a partial discharge is not detected.

In one embodiment of the method according to the invention, the flipflop output used is a Schmitt trigger. This is an advantage because what are known as Schmitt triggers have long been proven and widely used in analog circuitry.

In one embodiment of the method according to the invention, a sample-and-hold element is used to extend the duration of the digital signal. The downstream sample-and-hold element extends the duration of a detected pulse such that e.g. mechanical switching elements can be used to indicate a PD activity.

In one embodiment of the method according to the invention, analog electrical circuits are used each time for the sensor device, the filter device, the amplifier device, the flipflop output, the sample-and-hold element and the evaluation device. This is an advantage because analog circuits are particularly inexpensive and durable.

In one embodiment of the method according to the invention, the electromagnetic pulses are captured in a frequency range up to 2 GHz and a frequency width of no more than 200 MHz is used for the narrow frequency band.

Further, against the background of previously known arrangements for detecting partial discharges for an electrical apparatus by means of UHF evaluation, the invention is based on the object of specifying an arrangement that is usable comparatively easily and inexpensively for monitoring a GIS.

The invention achieves this object by means of an arrangement according to claim 8. Preferred embodiments emerge from dependent claims 9 to 14. In these, the same advantages as explained at the outset for the method according to the invention emerge mutatis mutandis for the arrangement according to the invention and the embodiments of said arrangement.

BRIEF DESCRIPTION OF THE DRAWINGS

The invention is explained better by means of a schematic depiction, in which.

DETAILED DESCRIPTION OF INVENTION

Figure 1:
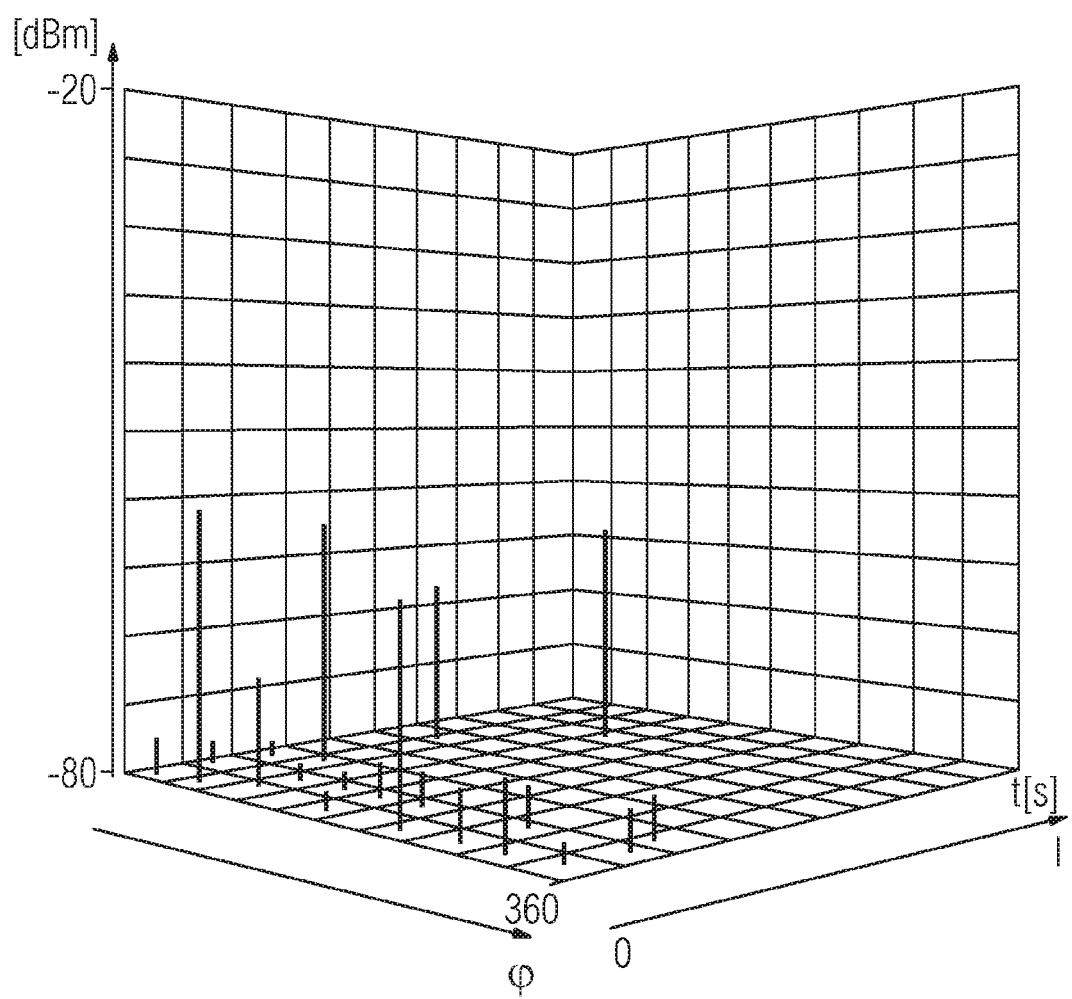
FIG. 1 shows an example of a distribution of partial discharges for a GIS unit.

FIG. 1 shows an example of a distribution of partial discharges for a gas-insulated electrical switchgear unit. The amplitude is plotted on the z axis, the phase angle φ is plotted on the x axis and the time in seconds is plotted on the y axis. The figure shows that partial discharges in a real gas-insulated switchgear unit occur more frequently at specific phase angles. This provides a person skilled in the art with an indication of that part of the gas-insulated electrical installation at which partial discharges occur internally. Typically, partial discharges in GIS occur multiple times per second if there is a fault in the switchgear. In modern GIS, no partial discharges should occur during normal operation despite the comparatively compact design with small insulating clearances.

Figure 2:
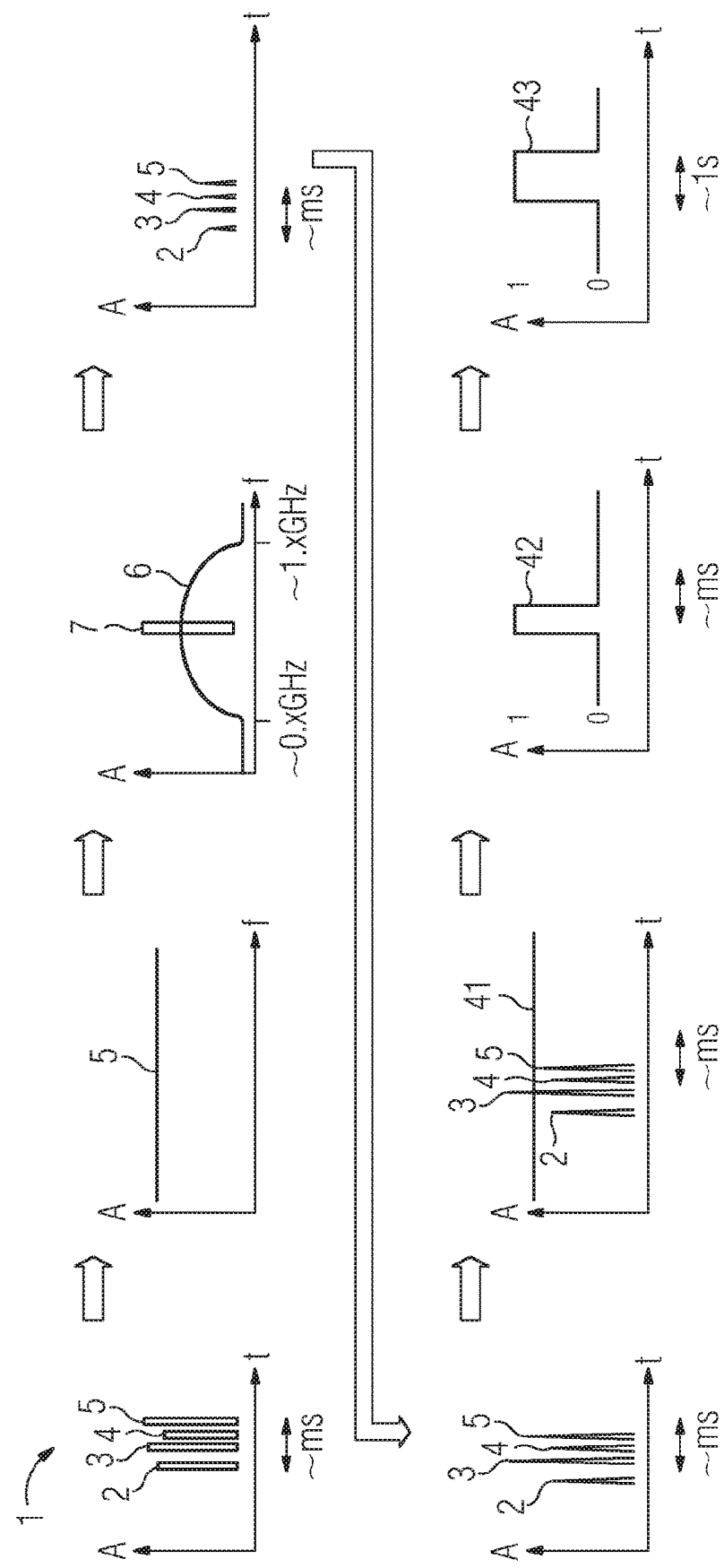
FIG. 2 shows an exemplary embodiment of the method according to the invention.

FIG. 2 shows an exemplary embodiment of the method 1 according to the invention. It depicts individual method steps, the amplitude on the upwardly oriented axis being denoted by the letter A each time. Beginning at the top left of the figure, four electromagnetic pulses 2, 3, 4, 5 in the millisecond range occur. The pulses 2, 3, 4, 5 are measured e.g. by means of a sensor or an internal antenna in the GIS.

In the next step, a single instance of these pulses 5 is depicted in the frequency domain. It can be seen that the pulse 5 is present over a very wide bandwidth, i.e. over a large frequency spectrum.

In the third image from the left, it can be seen that the single pulse 5 that is present from the previous image undergoes an attenuation. The attenuation is produced, depending on the design, by the gas-insulated switchgear and the antenna used (or the sensor) that picks up the electromagnetic pulse. In the example depicted, frequencies in the very low GHz range and in the range above 1 GHz are attenuated substantially by the design of the gas-insulated switchgear and the antenna. In the region of a few 100 MHz, however, the signal is present with a large amplitude and only low attenuation, this being indicated schematically by a semicircular arc 6. In this region 6 of low attenuation, a narrowband filter 7 is used. The narrowband filter 7 isolates a frequency component of the electromagnetic pulse 5 for further analysis. Typically, the frequency width of the narrowband filter is set to be less than 300 MHz, advantageously less than 200 MHz and even more advantageously less than 100 MHz.

The fourth image from the left in the first row shows that the four original pulses 2, 3, 4, 5 are present with distinctly reduced amplitude, plotted over time, after the narrowband filtering.

The next step is portrayed in the second row in the step on the far left. The signals 2, 3, 4, 5 are amplified and, in the next step, the second image from the left, compared with a threshold value 4' for the amplitude A. It is evident that only the signal 3 exceeds the threshold value 4' for the amplitude A. This signal 3 is supplied to a flipflop output in the next step. The flipflop output turns the signal into a binary signal, i.e. 0/1 or yes/no information 7 indicating whether or not there has been a partial discharge. Thus, the method according to the invention involves no complex pattern recognition taking place as in the case of previous methods for detecting partial discharges.

In the last step, the fourth image from the left in the second row, a sample-and-hold element is used to stretch the output duration of the signal 43 to the seconds range. This allows a display using simple mechanical or electronic display devices.

Ultimately, the use of the narrowband filter achieves a compromise between possible signal strength after filtering and the filtering-out of as much interference as possible. If for example a portion of all partial discharges occurring in the GIS, that is to say e.g. 3-5% of the partial discharges, is captured, then, of these, the method according to the invention is still able to detect and display e.g. half of the partial discharges after a filtering. This is not a problem for use under real conditions, however, because the simple and inexpensive approach of the method according to the invention detects periodically recurring partial discharges and displays this information to a person skilled in the art or maintenance personnel.

Figure 3:
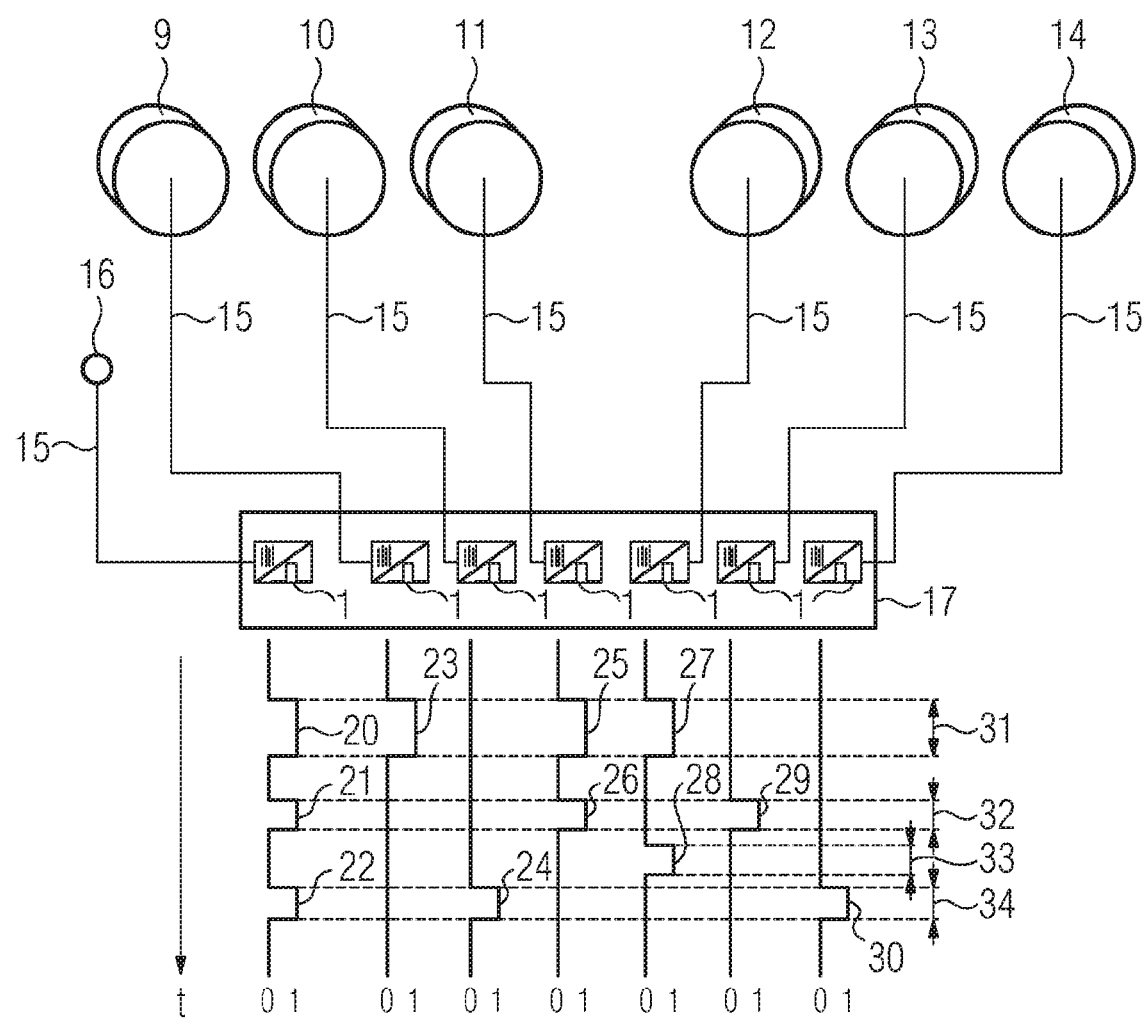
FIG. 3 shows a first exemplary embodiment of the use of internal and external antennas for a GIS unit.

FIG. 3 shows a first exemplary embodiment of the use of internal and external antennas for a gas-insulated switchgear unit. Six internal antennas 9-14 are used. Furthermore, one external antenna 16 is used, in order to capture externally acting electromagnetic radiation and to use it to evaluate and detect interference. The internal antennas 9-14 are located inside a gas-insulated switchgear unit. All the antennas 9-14, 16 are connected to an evaluation arrangement 17 via lines 15. In the evaluation arrangement 17, the method 1 according to the invention is performed for each of the antennas 9-14, 16, with a respective piece of binary information about whether or not there have been partial discharges being obtained for the received signals of the antennas 9-14, 16. The presence of signals indicating an internal partial discharge is plotted in the time domain and beneath the relevant internal antennas 9-14 or the external antenna 16 in each case.

It can be seen that the internal antennas 10, 11, 12 and the external antenna 16 pick up a signal 20, 23, 25, 27, which could be a partial discharge, at the same time. Since this signal has been picked up not only internally but also via the external antenna 16, however, said signal is rated not as a partial discharge but rather as an external source of interference 31. At a later time, the internal antennas 11, 13 capture the signals 26, 29. At the same time, however, the external antenna 16 likewise captures a signal 21. This signal is thus also attributed to an external source of interference 32 and not to a partial discharge. In the same manner, a further external source of interference 34 is obtained from the signals 22, 24, 30. External sources of interference of this kind may be mobile phone signals, for example, which transmit radio signals in an adjacent GHz frequency range.

However, there is within the recorded period of time a signal 28 that has been captured by the internal antenna 12. This signal is not present for any other internal or external antenna. This signal 28 is thus recorded as a partial discharge 33 and is displayed to the user. This example shows that the method according to the invention can be used just to ascertain binary information about whether a partial discharge is present. More accurate pattern recognition that an expert could use to discern further details about the cause of partial discharges does not take place. This is thought to allow up to 50% cheaper monitoring of a gas-insulated switchgear unit to be provided by means of the arrangement according to the invention. Previous systems having up to 100 channels for e.g. 13 sections of a gas-insulated switchgear unit have a market price of between 250 000 and 300 000 euros. By dispensing with the digital hardware and signal processing components and also the complex wiring and an incorporated PC, the simplified method or system presented here can be offered distinctly more cheaply.

Figure 4:
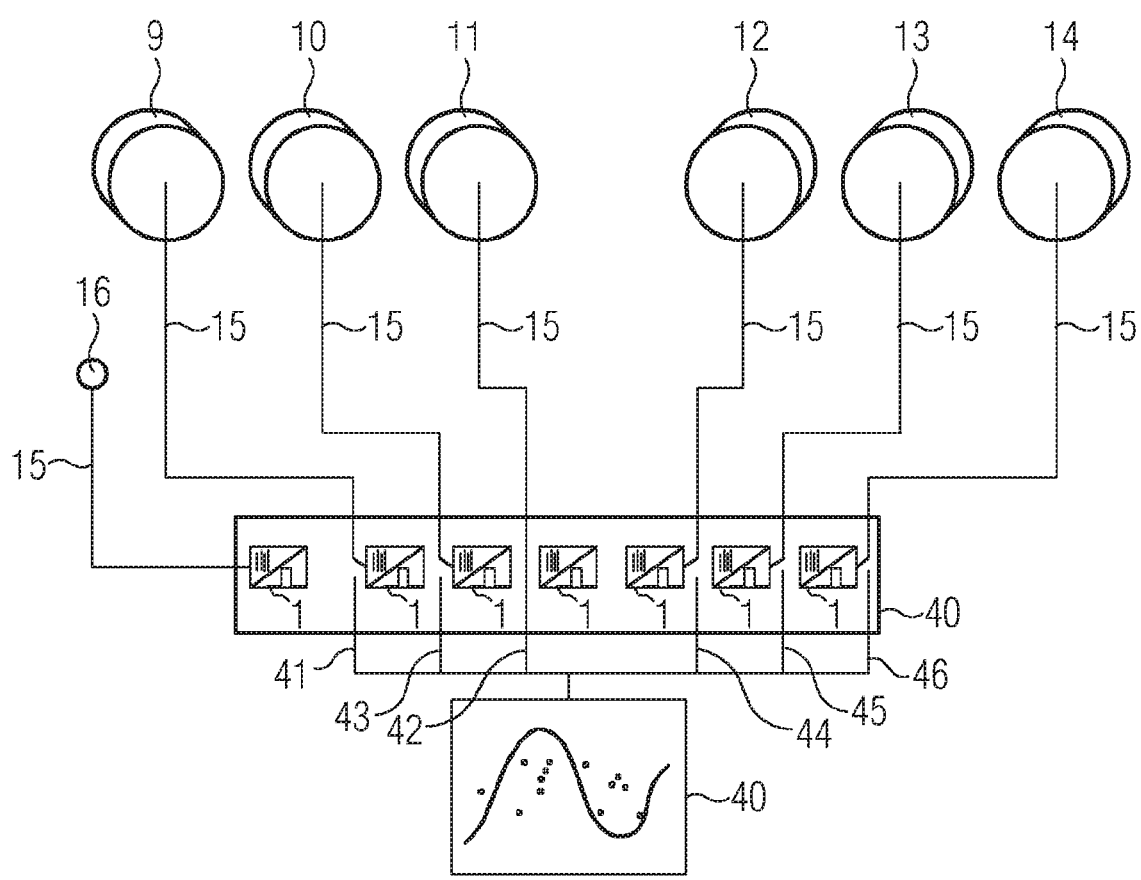
FIG. 4 shows a second exemplary embodiment of the use of internal and external antennas for a GIS unit.

FIG. 4 shows a second exemplary embodiment of the use of internal and external antennas 9-14, 16 for a gas-insulated switchgear unit. In this exemplary embodiment, in contrast to the exemplary embodiment shown in FIG. 3, there is provision for a pattern recognition device 40 for analyzing partial discharge details. Each of the internal antennas is additionally provided with a connection 41-46 that is connected to the internal antenna 9-14 via a switch. In the example depicted, the antennas 9, 11, 12, 13, 14 are each connected in the pattern recognition device 40 such that an evaluation by means of the simplified method 1 according to the invention takes place. Only the internal antenna 11 is connected via its connection 42 to the pattern recognition device 40. In this manner, an internal partial discharge detected at the antenna 11 can be analyzed more accurately by the pattern recognition device 40, for example, in order to identify a cause of fault. This can be effected for example such that initially all internal antennas are evaluated using the simplified method 1. The comparison with the external antenna produces, as explained at the outset, binary signals that are identified either as a partial discharge or as an external source of interference. If a partial discharge is then recorded for the antenna 11, for example, the antenna 11 can be connected to the pattern recognition device 40 via the connection 42 in order to subject partial discharges periodically occurring later to a more accurate analysis. This approach is very inexpensive because the wiring complexity is minimized and the necessary hardware for computationally complex pattern recognition, e.g. using what is known as a point-on-wave method, is provided only once.

Figure 5:
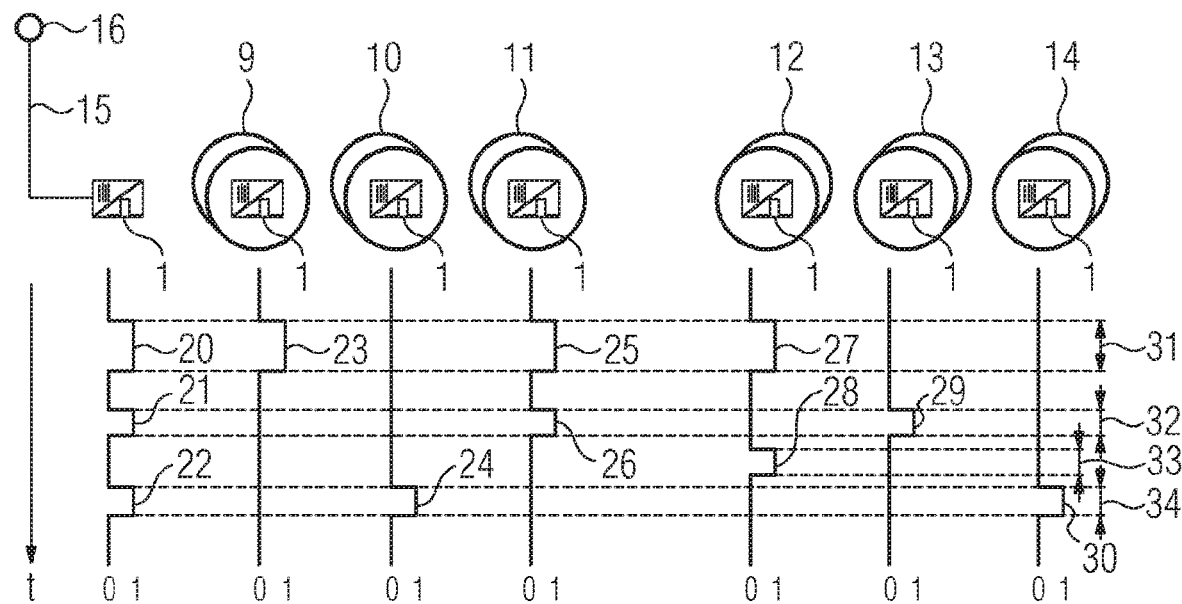
FIG. 5 shows a third exemplary embodiment of the use of internal and external antennas for a GIS unit.

FIG. 5 shows a third exemplary embodiment of the use of internal and external antennas 9-14, 16 for a gas-insulated switchgear unit. In contrast to the previous examples, a different design is advantageous in this case, however, in order to minimize interfering influences and signal attenuation by the cables 15 used. The internal antennas 9-14 are equipped such that the method 1 according to the invention can be installed directly in or on the connection boxes of the internal antennas.

Figure 6:
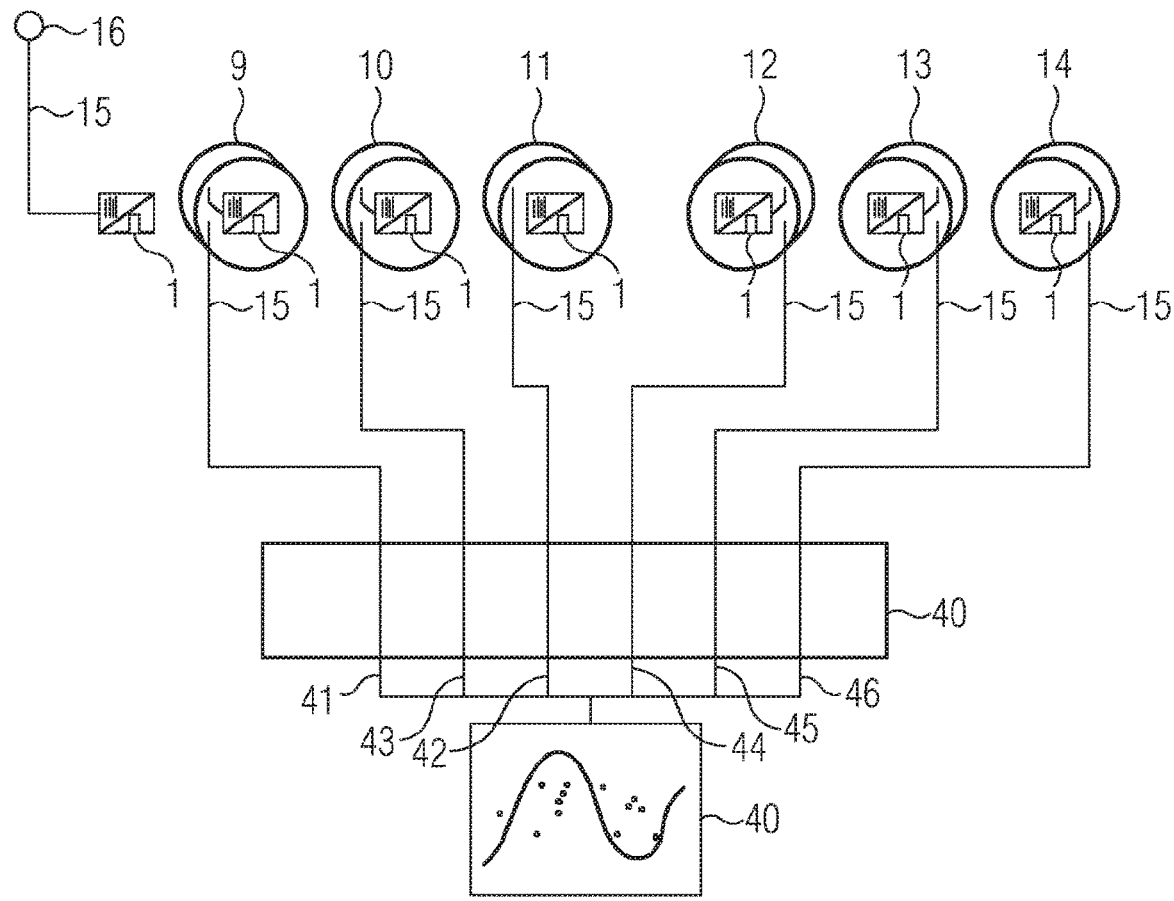
FIG. 6 shows a fourth exemplary embodiment of the use of internal and external antennas for a GIS unit.

FIG. 6 shows a fourth exemplary embodiment of the use of internal and external antennas for a gas-insulated switchgear unit. In this example, as in the exemplary embodiment shown in FIG. 5, a binary evaluation of received electromagnetic waves is performed for the internal antennas 9-14. The internal antennas 9-14 now likewise have a switching device as in FIG. 4, however, as a result of which a pattern recognition device 40 can be connected. In this example, the internal antenna 11 is connected to the pattern recognition device 40. In this manner, accurate evaluation and analysis of causes of fault for a partial discharge can take place even when the method according to the invention is used directly inside the connection boxes of the internal antennas.

The invention claimed is:

1. A method for detecting partial discharges for an electrical apparatus, comprising:
    capturing electromagnetic pulses with a sensor device,
    selecting a narrow frequency band from a frequency spectrum of the electromagnetic pulses with a filter device,
    amplifying the narrow frequency band each time with an amplifier device,
    comparing signals contained in the narrow frequency band with a threshold value for the amplitude with a comparison device, wherein a partial discharge is detected when the threshold value is exceeded; and
    wherein an analog signal representing a detected partial discharge is converted into a digital pulse by means of a flipflop output, wherein the digital pulse is further processed to indicate occurrence of the partial discharge,
    wherein the sensor device comprises an internal sensor device to detect internally-based interference signals and an external sensor device to detect externally-based interference signals, and wherein if both the internal and the external sensor devices receive an electromagnetic signal then the electromagnetic signal is an externally-based interference signal and is not further processed according to the method.

2. The method as claimed in claim 1, wherein the flipflop output used is a Schmitt trigger.

3. The method as claimed in claim 1, wherein a sample-and-hold element is used to extend the duration of the signal.

4. The method as claimed in claim 1, wherein analog electrical circuits are used each time for the sensor device, the filter device, the amplifier device, the flipflop output, a sample-and-hold element and the comparison device.

5. The method as claimed in claim 1, wherein the electromagnetic signals are captured in a frequency range up to 2 GHz and in that a frequency width of no more than 200 MHz is used for the narrow frequency band.

6. The method as claimed in claim 1, wherein a gas-insulated electrical switchgear unit is used for the apparatus.

7. An arrangement for detecting partial discharges for an electrical apparatus, comprising:
a sensor device for capturing electromagnetic signals,
a filter device designed to select a narrow frequency band from a frequency spectrum of the electromagnetic signals,
an amplifier device designed to amplify the narrow frequency band each time,
a comparison device designed to compare signals contained in the narrow frequency band with a threshold value for the amplitude, wherein a partial discharge is detected when the threshold value is exceeded, the partial discharge represented by an analog signal; and
a flipflop output for converting the analog signal into a digital pulse, wherein the digital pulse is further processed to indicate occurrence of the partial discharge,
wherein the sensor device comprises an internal sensor device to detect internally-based interference signals and an external sensor device to detect externally-based interference signals, and wherein if both the internal and the external sensor devices receive an electromagnetic signal then the electromagnetic signal is an externally-based interference signal and is not further processed by the arrangement.

8. The arrangement as claimed in claim 7, wherein the flipflop output comprises a Schmitt trigger.

9. The arrangement as claimed in claim 7, further comprising:
a sample-and-hold element for extending the duration of the signal.

10. The arrangement as claimed in claim 7, wherein the sensor device, the filter device, the amplifier device, the flipflop output, a sample-and-hold element and the comparison device are each in the form of analog electrical circuits.

11. The arrangement as claimed in claim 7, wherein the electromagnetic signals have a frequency range of up to 2 GHz and in that the narrow frequency band has a frequency width of no more than 200 MHz.

12. The arrangement as claimed in claim 7, wherein the apparatus comprises a gas-insulated electrical switchgear unit.

* * * * *